US006621755B2

United States Patent
Gans et al.

(10) Patent No.: US 6,621,755 B2
(45) Date of Patent: Sep. 16, 2003

(54) TESTMODE TO INCREASE ACCELERATION IN BURN-IN

(75) Inventors: Dean D. Gans, Boise, ID (US); John R. Wilford, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/943,367

(22) Filed: Aug. 30, 2001

(65) Prior Publication Data

US 2003/0048685 A1 Mar. 13, 2003

(51) Int. Cl.$^7$ .................................................. G11C 7/00
(52) U.S. Cl. ............. 365/230.03; 365/201; 365/189.05; 365/230.06
(58) Field of Search ........................ 365/230.01, 230.03, 365/189.01, 189.05, 230.06, 201

(56) References Cited

U.S. PATENT DOCUMENTS

| 5,416,740 A | * | 5/1995 | Fujita et al. ................ 365/200 |
| 5,440,516 A | * | 8/1995 | Slemmer ..................... 365/201 |
| 5,745,432 A | * | 4/1998 | McClure ................. 365/230.06 |
| 5,939,914 A | * | 8/1999 | McClure ..................... 327/198 |
| 5,991,232 A | * | 11/1999 | Matsumura et al. ........ 365/233 |
| 6,006,339 A | * | 12/1999 | McClure ..................... 713/500 |
| 6,144,594 A | * | 11/2000 | McClure ..................... 365/201 |
| 6,219,283 B1 | | 4/2001 | Wilford ....................... 365/189 |
| 6,487,131 B1 | * | 11/2002 | Clark et al. ................. 365/201 |

* cited by examiner

Primary Examiner—Viet Q. Nguyen
(74) Attorney, Agent, or Firm—Fletcher Yoder

(57) ABSTRACT

A method and apparatus for simultaneously accessing multiple array blocks in a static random access memory (SRAM) device. During testing of the SRAM device, each memory cell in each memory array block is accessed to ensure proper functionality. By providing logic gates on each SRAM device, the testing can be accelerated by writing to multiple array blocks at the same time, rather than in series.

21 Claims, 3 Drawing Sheets

TESTMODE TO INCREASE ACCELERATION IN BURN-IN

BACKGROUND OF THE INVENTION

1. Field of the Invention

The present invention relates generally to memory devices and, more particularly, to a technique and apparatus for accelerating a burn-in cycle in memory devices.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled integrated circuits are used in a wide variety of applications. Such applications include personal computers, vehicle control systems, telephone networks, and a host of consumer products. As is well known, microprocessors are essentially generic devices that perform specific functions under the control of a software program. This program is stored in a memory device which is coupled to the microprocessor. Not only does the microprocessor access memory devices to retrieve the program instructions, but it also stores and retrieves data created during execution of the program in one or more memory devices.

There are a variety of different memory devices available for use in microprocessor-based systems. The type of memory device chosen for a specific function within a microprocessor-based system generally depends upon which features of the memory are best suited to perform the particular function. Memory manufacturers provide an array of innovative fast memory chips for various applications, including Dynamic Random Access Memories (DRAM), which are lower in cost but have slower data rates, and Static Random Access Memories (SRAM), which are more costly but offer higher data rates.

Memory devices are typically mass produced by fabricating thousands of identical circuit patterns on a single semiconductor wafer and subsequently dividing them into identical die or chips. To produce the integrated circuit, many commonly known processes are used to modify, remove, and deposit material onto the semiconductor wafer, which is generally made of silicon. Once the active and passive parts are fabricated in and on the wafer surface, one or more layers of conductive material, such as metal, for electrically connecting circuit components is added, and a protective layer is deposited over the silicon wafer. The wafer is visually evaluated and electrically tested to determine which memory devices are good so that they may be packaged for use.

During the testing, the memory devices are generally "burned-in" to ensure that the cells, which are located at particular rows and columns within the memory device, are able to store data for future access reliably. Generally, burn-in includes writing data to each memory cell and then reading the data from the memory cell. The data read from each memory cell may then be compared to the data which was written to the memory cell to verify that the cell is storing the data properly. DRAMs are generally burned-in such that more than one row for a particular column can be burned-in simultaneously. However, SRAMs are generally burned-in one cell at a time since the write drivers in SRAMs are generally not able to drive enough current to write to several cells simultaneously, because the load is too great to be driven by the write driver. It would be advantageous to provide a technique for simultaneously burning in more than one row for a particular column in an SRAM device.

The present invention may address one or more of the problems set forth above.

BRIEF DESCRIPTION OF THE DRAWINGS

The foregoing and other advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
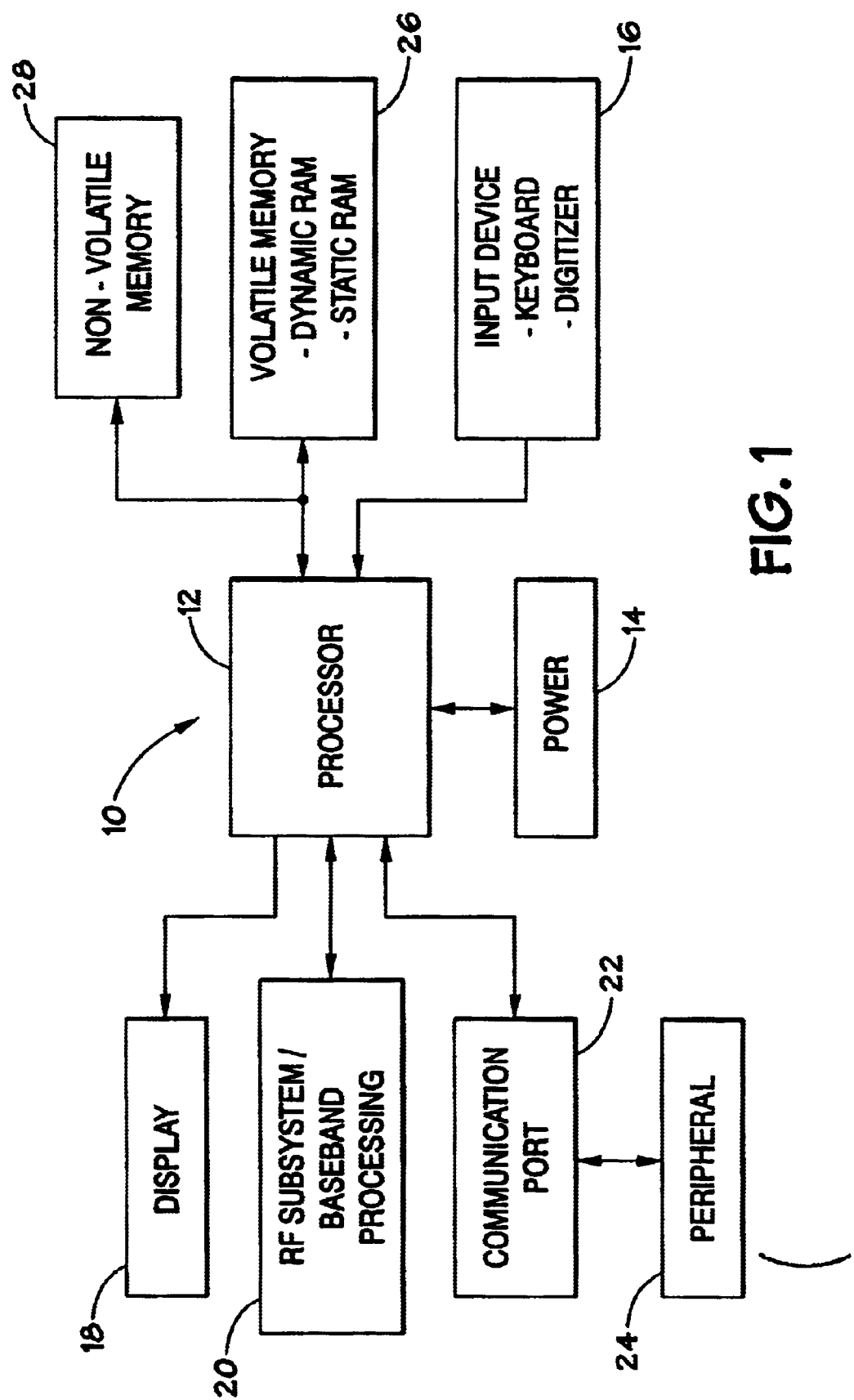
FIG. 1 illustrates a block diagram of an exemplary processor-based device in accordance with the present technique.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include an input device, such as buttons, switches, a keyboard, a light pin, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communication port 22 may also be coupled to the processor 12. The communication port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store and facilitate execution of the software program. For instance, the processor 12 may be coupled to volatile memory 26, which may include dynamic random access memory (DRAM), static random access memory (SRAM), Double Data Rate (DDR) memory, etc. The processor 12 may also be coupled to non-volatile memory 28. The non-volatile memory 28 may include a read only memory (ROM), such as an EPROM or Flash Memory, to be used in conjunction with the volatile memory. The size of the ROM is typically selected to be just large enough to store any necessary operating system, application programs, and fixed data. The volatile memory 26, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

Figure 2:
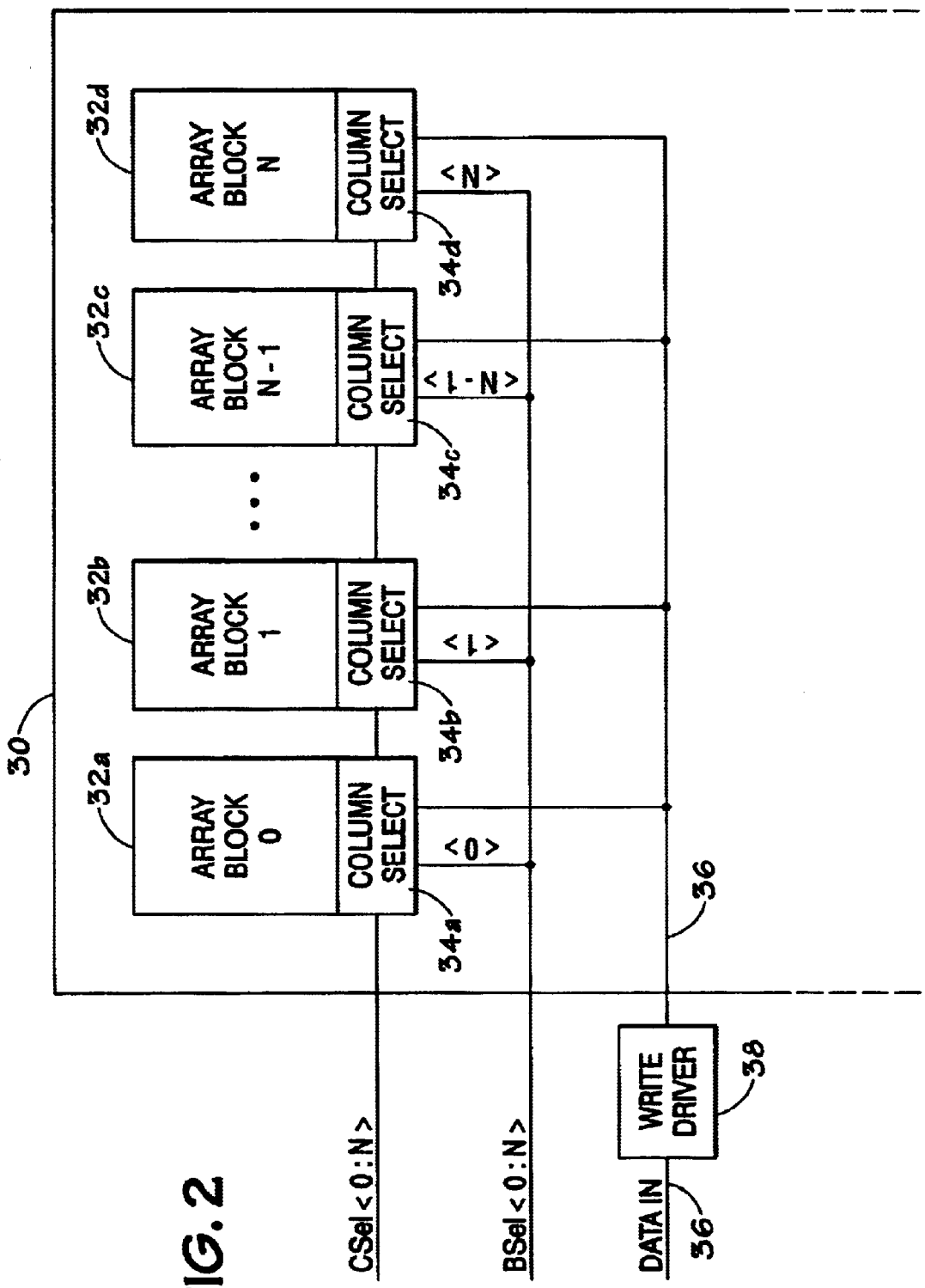
FIG. 2 illustrates a block diagram of an exemplary SRAM device.

As previously discussed, the volatile memory 26 may include one or more SRAM devices. FIG. 2 illustrates a simplified block diagram of a typical SRAM memory structure. The SRAM 30 generally includes a plurality of memory array blocks 32a–d. The number of array blocks may vary depending on the application and storage capacity of the memory device. Each array block 32a–d includes column select architecture 34a–d to provide proper column access based on a column select signal. The column select signal is provided from an external (requesting) device along a plurality of column select lines CSel<0:N>. The external or requesting device, which is located externally with respect to the SRAM 30, may include the processor 12 (FIG. 1), or some other component in the system 10. Alternatively, it may include a device which is located externally with respect to the system 10, such as peripheral device 24. The column select signal provides the column location corresponding to a particular set of data in memory which is being sought by a requesting device. Similarly, each array block 32a–d receives a block select signal along a block select line BSel<0:N>, wherein N represents the number of memory array blocks 32a–d. Each array block 32a–d may also receive a row select signal (not illustrated) which may include the particular row containing the data requested by the external device. A Data In line 36 is coupled to each memory array block 32a–d to provide an access path between the external devices and each memory array block 32a–d for write requests. A write driver 38, residing externally with respect to the SRAM 30, may be provided to drive the data to the memory array blocks 32a–d along the Data In line 36.

In the block diagram illustrated in FIG. 2, an external device sends data to a memory cell in a particular memory array block 32a–d by implementing the column select lines CSel<0:N> and the array block select lines BSel<0:N> to provide access to a desired block and column. During burn-in testing, each memory cell may be written to ensure that the cell properly stores data. Test software generally toggles through each memory cell of each memory column of each memory block. Based on the configuration illustrated in FIG. 2, the burn-in testing is generally performed one cell at a time since the write driver 38 is heavily loaded and is not powerful enough to drive data to more than one memory block 32a–d at a time. This burn-in process is slow and cumbersome since the testing of each cell is performed in series.

One solution to the inadequacies of the external write driver 38 is to provide a plurality of write drivers residing locally (on-chip) with respect to the SRAM 30, one write driver for each memory array block 32a–d. However, this configuration alone does not allow for simultaneous burn-in of multiple array blocks 32a–d because there is no way to drive the array block select signal lines BSel<0:N> high externally due to the unique addresses of each memory cell. Because Bsel<0:N> is generally decoded from addresses supplied externally from a user, it is inherent that only one bit of Bsel<0:N> will be driven high on any given cycle.

Figure 3:
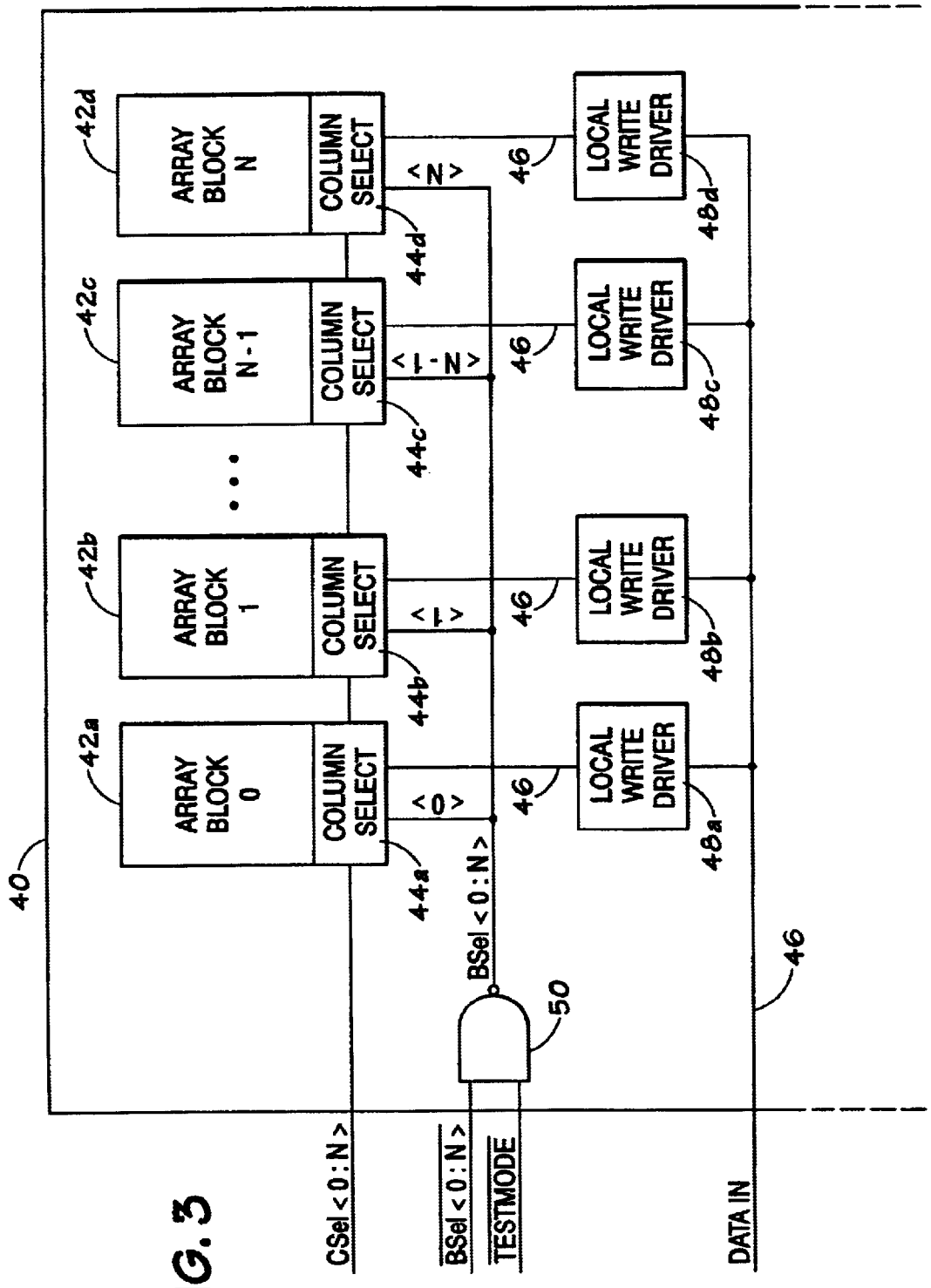
FIG. 3 illustrates a block diagram of an exemplary technique for performing simultaneous burn-in of more than one array block in an SRAM device.

FIG. 3 illustrates a simplified block diagram of an SRAM 40 which provides a technique for simultaneously burning-in each memory array block 42a–d during a burn-in Testmode. The simultaneous burn-in of each memory array block 42a–d reduces the burn-in cycle time by a factor of N, wherein N corresponds to the number of memory array blocks 42a–d on a particular SRAM 40. As previously described with reference to FIG. 2, each array block 42a–d includes column select architecture 44a–d to provide proper column access based on a column select signal which is provided from an external (requesting) device along a plurality of column select lines CSel<0:N>. The external or requesting device, which is located externally with respect to the SRAM 30, may include the processor 12, or some other component in the system 10, or it may include a device which is located externally with respect to the system 10, such as peripheral device 24. The column select signal provides the column location corresponding to a particular set of data in memory which is being sought by a requesting device. Similarly, each array block 42a–d receives a block select signal along a block select line BSel<0:N>, wherein N represents the number of memory array blocks 42a–d. A Data In line 46 is coupled to each memory array block 42a–d to provide an access path between the external devices and each memory array block 42a–d for write requests. Local write drivers 48a–d, residing locally with respect to the SRAM 40 (on-chip), may be provided to drive the data to the memory array blocks 42a–d along the Data In line 46. In the present embodiment, one write driver 48a–d is provided to drive data to each of the memory array blocks 42a–d. Thus, in this example, there is a one-to-one correspondence between the memory array blocks 42a–d and the local write drivers 48a–d. Alternatively, a single local write driver may be used to drive the data to more than one memory array block. For instance, a local write driver may be used to drive the data to two memory array blocks 42a and 42b, or even all of the memory array blocks 42a–d.

In addition, a NAND gate 50 is provided to facilitate the writing of the same data to more than one memory array block 42a–d simultaneously. The inverse of the array block select signal BSel<0:N> is delivered to a first input of the NAND gate 50. An inverted TESTMODE signal is delivered to the second input of the NAND gate 50. The TESTMODE signal provides the option of delivering data to more the one memory array block 42a–d simultaneously. As previously discussed, this technique is particularly useful during burn-in testing of the SRAM 40. When the TESTMODE signal is enabled, the output of the NAND gate 50 delivers a logical high signal at each bit location in the output signal. This enables write access of the data on the Data In line 46 to the memory cells in series in each of the memory array blocks 42a–d. This increases the memory cell access duty cycle by a factor of N while the SRAM 40 is running in Testmode. When the SRAM 40 is in a normal mode of operation, each bit of the TESTMODE signal delivers a logical high to the NAND gate, thereby deactivating the simultaneous writes to the memory array blocks 42a–d and allowing selective write access to the individual array blocks 42a–d. The following logic table may be useful in better understanding the logical signal flow and the activation of the simultaneous array block access:

TABLE 1

| MODE | TESTMODE | BSEL | $\overline{\text{TESTMODE}}$ | $\overline{\text{BSEL}}$ | OUTPUT |
|---|---|---|---|---|---|
| TESTMODE | 1 | 1 | 0 | 0 | 1 |
|  | 1 | 0 | 0 | 1 | 1 |
| NORMAL | 0 | 1 | 1 | 0 | 1 |
|  | 0 | 0 | 1 | 1 | 0 |

When the output of the NAND gate 50 is a logical high, access to a particular memory array block 42a–d is enabled. Thus, for every bit of the output of the NAND gate 50 which is a logical high, data will be driven from the Data In line 46 into the memory array block 42a–d corresponding to the enabled bit. When the SRAM 40 is in Testmode, each bit of the TESTMODE signal is driven to a logical high. As indicated by Table 1 above, anytime Testmode is enabled, data will be delivered to the memory array blocks 42a–d corresponding to the enabled bits. Since each of the bits is driven high during Testmode, each memory array block 42a–d is written simultaneously. As previously stated, this is particularly beneficial during burn-in testing since the test can be performed in a fraction of the time previously necessary. Once the SRAM 40 has been tested and the device is incorporated into a system to operate in a normal mode of operation, the output of the NAND gate 50 ensures that only the bit corresponding to the enabled block select signal will receive data on the Data In line 46, as indicated by Table 1. While this technique is particularly useful during burn-in of a memory device, it provides simultaneous write-access capabilities in the SRAM 40 which may also be beneficial in other post burn-in applications.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system comprising:
   a processor; and
   at least one synchronous random access memory (SRAM) device comprising:
   a plurality of memory array blocks each configured to store data;
   a write driver located locally with respect to the plurality of memory array blocks and configured to receive data on an input line and to drive the data into one or more of the plurality of memory array blocks on one or more data lines coupled between the write driver and the plurality of memory array blocks; and
   at least one logical device configured to provide a block select signal to each of the plurality of memory array blocks such that each of the plurality of memory array blocks may receive data from the write driver simultaneously;
   wherein the at least one logical device is configured to receive a testmode signal, wherein enabling the testmode signal provides write access to each of the plurality of memory array blocks simultaneously; and
   wherein the testmode signal is enabled during burn-in testing of the SRAM device.

2. The system, as set forth in claim 1, wherein the write driver comprises a plurality of write drivers, each of the plurality of write drivers corresponding to one of the plurality of memory array blocks and each of the plurality of write drivers having a corresponding input line coupled between the write driver and the corresponding one of the plurality of memory array blocks, wherein the corresponding input line provides a path on which to drive the data from the write driver into the corresponding one of the plurality of memory array blocks.

3. The system, as set forth in claim 1, wherein the at least one logical device is configured to receive one or more block select signals, the one or more block select signals corresponding to a one of the plurality of memory array blocks and wherein enabling the one or more block select signals provides write access to the corresponding one of the plurality of memory array blocks.

4. The system, as set forth in claim 1, wherein the at least one logical device comprises one or more NAND gates, each NAND gate corresponding to one of the plurality of memory array blocks and configured to receive the block select signal and the testmode signal.

5. A memory device comprising:
   a plurality of memory array blocks each configured to store data;
   a write driver located locally with respect to the plurality of memory array blocks and configured to receive data on an input line and to drive the data into the plurality of memory array blocks on data lines coupled between the write driver and the plurality of memory array blocks; and
   at least one logical device configured to provide a block select signal to each of the plurality of memory array blocks such that each of the plurality of memory array blocks may receive data from the write driver simultaneously;
   wherein the at least one logical device is configured to receive a testmode signal, wherein enabling the testmode signal provides write access to each of the plurality of memory array blocks simultaneously; and
   wherein the testmode signal is enabled during burn-in testing of the memory device.

6. The memory device, as set forth in claim 5, wherein the write driver comprises a plurality of write drivers, each of the plurality of write drivers corresponding to one of the plurality of memory array blocks and each of the plurality of write drivers having a corresponding input line coupled between the write driver and the corresponding one of the plurality of memory array blocks, wherein the corresponding input line provides a path on which to drive the data from the write driver into the corresponding one of the plurality of memory array blocks.

7. The memory device, as set forth in claim 5, wherein the at least one logical device is configured to receive one or more block select signals, the one or more block select signals corresponding to a one of the plurality of memory array blocks and wherein enabling the one or more block select signals provides write access to the corresponding one of the plurality of memory array blocks.

8. The memory device, as set forth in claim 5, wherein the at least one logical device comprises one or more NAND gates, each NAND gate corresponding to one of the plurality of memory array blocks and configured to receive the block select signal and the testmode signal.

9. The memory device, as set forth in claim 5, wherein the memory device comprises a synchronous random access memory (SRAM) device.

10. A method of manufacturing a memory device, comprising the acts of:

providing a plurality of memory array blocks each configured to store data;

providing a write driver located locally with respect to the plurality of memory array blocks and configured to receive data on an input line and to drive the data into the plurality of memory array blocks on data lines coupled between the write driver and the plurality of memory array blocks; and providing at least one logical device configured to provide a block select signal to each of the plurality of memory array blocks such that each of the plurality of memory array blocks may receive data from the write driver simultaneously;

wherein providing at least one logical device comprises providing one or more NAND gates, each NAND gate corresponding to one of the plurality of memory array blocks and configured to receive a block select signal and a testmode signal.

11. The method of manufacturing a memory device, as set forth in claim 10, wherein the act of providing a write driver comprises the act of providing a plurality of write drivers, each of the plurality of write drivers corresponding to one of the plurality of memory array blocks and each of the plurality of write drivers having a corresponding input line coupled between the write driver and the corresponding one of the plurality of memory array block, wherein the corresponding input line provides a path on which to drive the data from the write driver into the corresponding one of the plurality of memory array blocks.

12. The method of manufacturing a memory device, as set forth in claim 10, wherein the act of providing at least one logical device comprises the act of providing at least one logical device which is configured to receive one or more block select signals, the one or more block select signals corresponding to one of the plurality of memory array blocks and wherein enabling the one or more block select signals provides write access to the corresponding one of the plurality of memory array blocks.

13. The method of manufacturing a memory device, as set forth in claim 12, comprising the act of configuring at least one logical device to receive the testmode signal wherein enabling the testmode signal provides write access to each of the plurality of memory array blocks simultaneously.

14. A system comprising:

a processor; and at least one synchronous random access memory (SRAM) device comprising:

a plurality of memory array blocks each configured to store data;

a write driver located locally with respect to the plurality of memory array blocks and configured to receive data on an input line and to drive the data into one or more of the plurality of memory array blocks on one or more data lines coupled between the write driver and the plurality of memory array blocks; and at least one logical device configured to provide a block select signal to each of the plurality of memory array blocks such that each of the plurality of memory array blocks may receive data from the write driver simultaneously;

wherein the at least one logical device is configured to receive a testmode signal, wherein enabling the testmode signal provides write access to each of the plurality of memory array blocks simultaneously; and wherein the at least one logical device comprises one or more NAND gates, each NAND gate corresponding to one of the plurality of memory array blocks and configured to receive the block select signal and the testmode signal.

15. The system, as set forth in claim 14, wherein the write driver comprises a plurality of write drivers, each of the plurality of write drivers corresponding to one of the plurality of memory array blocks and each of the plurality of write drivers having a corresponding input line coupled between the write driver and the corresponding one of the plurality of memory array blocks, wherein the corresponding input line provides a path on which to drive the data from the write driver into the corresponding one of the plurality of memory array blocks.

16. The system, as set forth in claim 14, wherein the at least one logical device is configured to receive one or more block select signals, the one or more block select signals corresponding to a one of the plurality of memory array blocks and wherein enabling the one or more block select signals provides write access to the corresponding one of the plurality of memory array blocks.

17. The system, as set forth in claim 14, wherein the testmode signal is enabled during burn-in testing of the SRAM device.

18. A memory device comprising:

a plurality of memory array blocks each configured to store data;

a write driver located locally with respect to the plurality of memory array blocks and configured to receive data on an input line and to drive the data into the plurality of memory array blocks on data lines coupled between the write driver and the plurality of memory array blocks; and at least one logical device configured to provide a block select signal to each of the plurality of memory array blocks such that each of the plurality of memory array blocks may receive data from the write driver simultaneously;

wherein the at least one logical device is configured to receive a testmode signal, wherein enabling the testmode signal provides write access to each of the plurality of memory array blocks simultaneously; and wherein the at least one logical device comprises one or more NAND gates, each NAND gate corresponding to one of the plurality of memory array blocks and configured to receive the block select signal and the testmode signal.

19. The memory device, as set forth in claim 18, wherein the write driver comprises a plurality of write drivers, each of the plurality of write drivers corresponding to one of the plurality of memory array blocks and each of the plurality of write drivers having a corresponding input line coupled between the write driver and the corresponding one of the plurality of memory array blocks, wherein the corresponding input line provides a path on which to drive the data from the write driver into the corresponding one of the plurality of memory array blocks.

20. The memory device, as set forth in claim 18, wherein the at least one logical device is configured to receive one or more block select signals, the one or more block select signals corresponding to a one of the plurality of memory array blocks and wherein enabling the one or more block select signals provides write access to the corresponding one of the plurality of memory array blocks.

21. The memory device, as set forth in claim 18, wherein the testmode signal is enabled during burn-in testing of the memory device.

* * * * *